(12) United States Patent
Chen et al.

(10) Patent No.: US 9,818,574 B2
(45) Date of Patent: Nov. 14, 2017

(54) BEAM TRANSMISSION SYSTEM AND METHOD THEREOF

(71) Applicant: Kingstone Semiconductor Limited Company, Shanghai (CN)

(72) Inventors: Jiong Chen, San Jose, CA (US);
Junhua Hong, Shanghai (CN); Jin Zhang, Shanghai (CN); Jeff Boeker, Shanghai (CN)

(73) Assignee: Kingston Semiconductor Company, Limited (CN)

( * ) Notice: Subject to any disclaimer, the term of this patent is extended or adjusted under 35 U.S.C. 154(b) by 0 days.

(21) Appl. No.: 15/150,090

(22) Filed: May 9, 2016

(65) Prior Publication Data
US 2017/0011898 A1 Jan. 12, 2017

(51) Int. Cl.
*H01J 49/00* (2006.01)
*H01J 37/147* (2006.01)
*H01J 49/06* (2006.01)
*H01J 37/317* (2006.01)
*H01J 37/30* (2006.01)

(52) U.S. Cl.
CPC ........ *H01J 37/147* (2013.01); *H01J 37/3007* (2013.01); *H01J 37/3171* (2013.01); *H01J 49/06* (2013.01); *H01J 2237/10* (2013.01); *H01J 2237/15* (2013.01)

(58) Field of Classification Search
CPC .. H01J 37/10; H01J 37/12; H01J 37/14; H01J 37/141; H01J 37/145; H01J 37/147; H01J 37/1471; H01J 37/1472; H01J 37/1475; H01J 37/1477; H01J 37/15; H01J 37/3447; H01J 2237/24528

USPC ............. 250/396 R, 397, 398, 396 ML
See application file for complete search history.

(56) References Cited

U.S. PATENT DOCUMENTS

| | | | | |
|---|---|---|---|---|
| 2009/0267001 A1* | 10/2009 | Huang | ............ | H01J 37/20 250/492.21 |
| 2011/0180702 A1* | 7/2011 | Flory | ............ | H01J 49/406 250/282 |
| 2015/0311037 A1* | 10/2015 | Kabasawa | ........ | H01J 37/3171 250/397 |

* cited by examiner

*Primary Examiner* — Nicole Ippolito
(74) *Attorney, Agent, or Firm* — Bo-In Lin

(57) ABSTRACT

A beam current transmission system and method are disclosed. The beam current transmission system comprises an extraction device, a mass analyzer, a divergent element, a collimation element and a speed change and turning element, wherein an analysis plane of the mass analyzer is perpendicular to a convergent plane of the extracted beam, and after entering an entrance, the beam is converged on a convergent point in a plane perpendicular to the analysis plane, and then is diverged from the convergent point and transmitted to the divergent element from an exit; the collimation element is used for parallelizing the beam in a transmission plane of the beam; and the speed change and turning element is used for enabling the beam to change speed so as to achieve a target energy while the beam is deflected so that the transmission direction of the beam changes by a first pre-set angle. Through the coordinated cooperation among a plurality of beam current optical elements, a relatively wider distribution can be formed in a vertical plane, so the invention is suitable to the processing of a wafer with a large size and also ensure better injection uniformity on the premise of avoiding energy contamination.

16 Claims, 3 Drawing Sheets

BEAM TRANSMISSION SYSTEM AND METHOD THEREOF

FIELD OF THE INVENTION

The invention relates to a system and method for beam transmission system. Specifically, this invention relates to a beam transmission system and a beam transmission method for low-energy, high current ion implanters for manufacturing advanced integrated circuit (IC) devices.

BACKGROUND OF THE INVENTION

Ion implanters are widely used in IC manufacture. Different styles implanters are used according to the different circumstances. When making transistors, shallow junctions need to be done with low energy but high dose. In 1978 a true high current ion implanter (current: 10 mA, energy: 80 keV) was firstly developed. After several decades study, the current of implanters reaches 40 mA, wafer size is increased from 50 mm to 300 mm.

The depth of source-drain junction decreases as the shrink of semiconductor devices sizes (beyond the 20 nm technology node), thus ultra-low energy implantation is needed to achieve a shallow junction. To achieve a low energy beam, usually the beam is extracted under a high energy (more than 1 keV) and then decelerated to a target energy (e.g. 700 eV) because of the space-charge effect. Yet before or during the deceleration, energy contamination is caused by neutral particles which are created by the charge exchange between ions and residual gas molecules. Apparently the energy contamination must be avoided since it will deteriorate the formation of the shallow junctions.

Besides, when 300 mm-sized wafers are used, the implantation could be implemented by wafers' 1D mechanically scanning and the usage of a uniform linear ion beam or a uniform ribbon-shaped beam. When wafer size increases to 450 mm, spot-shaped ion beam and 2D mechanical scanning are usually used. Under such circumstance, the uniformity of beam's intensity and angle needs to be ensured in order to achieve a high quality fabrication. Especially in 450 mm process, when a linear ion beam or a ribbon-shaped beam is used, the beam current intensity and angle must be uniform in a large dimension (>450 mm).

Therefore, ultra-low energy implantation is needed for forming a shallow junction as the integration is higher (e.g. 20 nm technology node). Meanwhile, the energy contamination must be avoided and the uniformity of beam current intensity and angle need to be ensured to achieve high quality when 450 mm wafers are to be processed. Thus, a new concept beam line to address the above requirements and to suit high-integrated, large-size wafers is needed.

SUMMARY OF THE PRESENT INVENTION

The invention intends to propose a beam transmission system and method thereof, which could precisely control the uniformity of ion beam and avoid energy contamination when processing larger wafers. The invention suits the needs of high integration, the beam could cover 450 mm wafer and the minimum energy is below 1 keV. Meanwhile, the energy contamination can be avoided while beam current intensity is uniform, as well as the implantation angle.

A beam transmission system, comprising an ion source and an extraction device, wherein the extraction device is for extracting a focused beam, the beam transmission system further including: a mass analyzer, a divergent element, a collimation element and a speed change and turning element provided next to the collimation element, the mass analyzer includes an entrance and an exit, wherein an analysis plane of the mass analyzer is perpendicular to a convergent plane of the extracted beam, the mass analyzer is used for deflecting the beam in the analysis plane so that trajectories of ion beams with different mass-to-charge ratios are formed in the analysis plane, and after entering the entrance, the beam is converged on a convergent point in a plane perpendicular to the analysis plane, and then diverged from the convergent point and transmitted to the divergent element from the exit, the divergent element is for diverging the beam to a predetermined width in a vertical plane and then the beam is transmitted to the collimation element, the vertical plane is perpendicular to the analysis plane and parallel to the transmission direction of the beam at the exit, the collimation element is used for parallelizing the beam in a transmission plane of the beam, and the speed change and turning element is used for enabling the beam to change speed so as to achieve a target energy while the beam is deflected so that the transmission direction of the beam is changed by a first pre-set angle.

Through the coordinated cooperation among a plurality of optical elements, a relatively wider distribution can be formed in a vertical plane, so the beam transmission system could be applied to the processing of a wafer with a large size. Also, since in the mass analyzer the beam is firstly converged and then diverged (in the vertical direction perpendicular to the analysis plane), the beam width at the entrance in the vertical plane is smaller, which means the size of the entrance can be decreased. Thus the magnet field in the mass analyzer is more uniform and the restraint to the beam shape in the vertical direction is better. The neutral particles are filtered by deflecting the beam with the speed change and turning element so as to achieve a better processing quality with little energy contamination.

Preferably, the beam transmission system further comprising: a turning element between the collimation element and the speed change and turning element, the turning element is for deflecting the beam so that the transmission direction of the beam is changed by a second pre-set angle.

In said technical solution, the neutral particles are filtered by two deflections since two deflecting elements are arranged and each deflection angle could be small. Thus, the beam shape is easier to retain and the deformation of the beam can be avoided since the deflection angle each time is not big. Therefore even in the implantation position the beam uniformity (beam current intensity uniformity and implantation angle uniformity) is desired.

Preferably, the divergent element is a linear quad pole magnet. With the quad pole magnet, the beam is converged in the analysis plane while being diverged in the vertical plane so that ion beams of the same kind will be focused, then different ion beams in the beam will separate and only desired ion beam will be processed by downstream elements. Ion beams of the same kind are focused so that ion beams of different mass-to-charge ratios are separated in the analysis plane (namely ion beams of different mass-to-charge ratios have respective trajectories). Thus, the resolution of the beam transmission system is better, which optimizes the process quality and lowers the possibility of undesired doping.

Preferably, the collimation element is for deflecting the beam in order to change the transmission direction by a third pre-set angle.

Preferably, the predetermined width is 450 mm-750 mm.

A beam transmission method comprising the steps of:

step S1: extracting a focused beam from an ion source and transmitting the beam into a mass analyzer, the mass analyzer includes an entrance and an exit, wherein an analysis plane of the mass analyzer is perpendicular to a convergent plane of the extracted beam, step S2: deflecting the beam in the analysis plane by the mass analyzer so that trajectories of ion beams with different mass-to-charge ratios are formed in the analysis plane, wherein after entering the entrance, the beam is converged on a convergent point in a plane perpendicular to the analysis plane, and then diverged from the convergent point and are transmitted to the divergent element from the exit, step S3: diverging the beam to a predetermined width in a vertical plane, the vertical plane is perpendicular to the analysis plane and parallel to the transmission direction of the beam at the exit, step S4: parallelizing the beam in a transmission plane of the beam, step S5: deflecting the transmission direction of the beam by a first pre-set angle and changing beam's speed to a target energy.

With the beam transmission method, a relatively wider distribution can be formed in a vertical plane, so the beam transmission method could be applied to the processing of a wafer with a large size. Also, since in the mass analyzer the beam is firstly converged and then diverged (in the vertical direction perpendicular to the analysis plane), the beam width at the entrance in the vertical plane is smaller, which means the size of the entrance can be decreased. Thus the magnet field in the mass analyzer is more uniform and the restraint to the beam shape in the vertical direction is better. The neutral particles are filtered by deflecting the beam so as to achieve a better processing quality with little energy contamination.

Preferably, between step S4 and step S5: deflecting the beam so that the transmission direction of the beam is changed by a second pre-set angle.

In said technical solution, before implantation, the neutral particles are filtered twice and each deflection angle could be small. Thus, the beam shape is easier to retain since the deflection angle each time is not big. Therefore even in the implantation position the beam uniformity is desired since the deformation of beam shape due to the big deflection angle is avoided.

Preferably, in step S3, the beam is converged in the analysis plane while being diverged in the vertical plane so that ion beams of the same kind will be focused, then different ion beams in the beam will separate and only desired ion beam will be processed by downstream elements. Ion beams of the same kind are focused so that ion beams of different mass-to-charge ratios are separated in the analysis plane (namely ion beams of different mass-to-charge ratios have respective trajectories). Thus, the resolution of the beam transmission system is better, which optimizes the process quality and lowers the possibility of undesired doping.

Preferably, in step S4, deflecting the beam in order to change the transmission direction by a third pre-set angle.

Preferably, the predetermined width is 450 mm-750 mm.

A number of alternative processing steps and structural elements have been suggested for the preferred embodiment.

The advantages of the invention are as follows:

1. Through the coordinated cooperation among a plurality of optical elements, a relatively wider distribution can be formed in a vertical plane, so the beam transmission system could be applied to the processing of a wafer with a large size (e.g. 450 mm). Also, the invention suits the needs of high integration since beam's energy is decreased to less than 1 keV before implantation and shallow junctions could be formed.

2. In the invention, the beam extracted from the ion source is converged on a convergent point in a plane perpendicular to the analysis plane, and then diverged from the convergent point, namely a cross-over beam is formed. Thus the size of the entrance can be decreased and the magnet field in the mass analyzer is more uniform, so it's easier to restrain the beam.

3. Through at least one turning element, the neutral particles produced from the residual gas can be filtered and the energy contamination can be avoided. Besides, the deflection angle of each time can be controlled by the usage of multiple turning elements, thus beam's deflection in the direction perpendicular to the analysis plane could be finished gradually. In doing so, the deformation of the beam caused by large deflection angle can be avoided, and the beam shape can be retained while the energy contamination is drastically reduced. Therefore, the uniformity of implantation is ensured.

4. The linear quad pole magnet is used as the divergent element, so the beam is converged in the analysis plane while being diverged in the vertical plane so that different ion beams in the beam will separate. Therefore, the resolution of the beam transmission system is better.

DETAILED DESCRIPTION OF THE EMBODIMENTS

Embodiment 1

Figure 1:
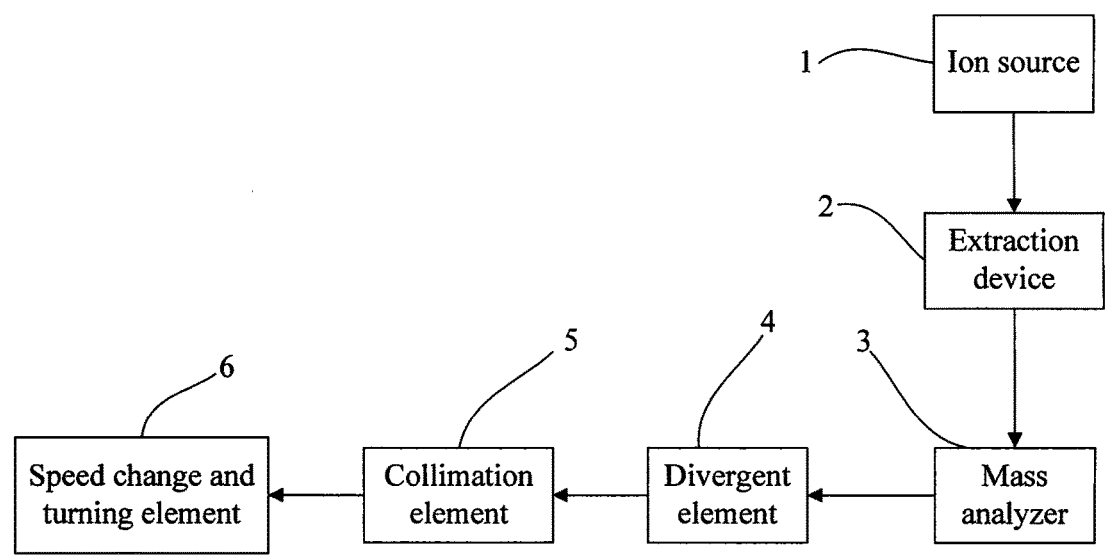
FIG. 1 is a structured flowchart illustrating the beam transmission system of embodiment 1.

Refer to FIG. 1-FIG. 4, the beam transmission system and method thereof is disclosed. In the embodiment, the beam transmission system, comprising an ion source 1 and an extraction device 2, wherein the extraction device 2 is for extracting a focused beam from the ion source 1, the beam transmission system further including: a mass analyzer 3, a divergent element 4, a collimation element 5 and a speed change and turning element 6 provided next to the collimation element 5, the mass analyzer 3 includes an entrance and an exit, wherein an analysis plane of the mass analyzer 3 is perpendicular to a convergent plane of the extracted beam (with the reference of FIG. 2-FIG. 4), Wherein, the mass analyzer 3 is used for deflecting the beam in the analysis plane so that trajectories of ion beams with different mass-to-charge ratios are formed in the analysis plane (refer to FIG. 2 the beam comprises three ion beams with different mass-to-charge ratios, ion beam 101, ion beam 102 and ion beam 103, respectively. Due to the different mass-to-charge ratios, the trajectories of these three ion beams are separated in the analysis plane (ion beam with the same mass-to-charge is denoted by the same number, only ion beam 101 is transmitted to the divergent element 4), in the embodiment, ion beam 101 is to be implanted), and after entering the entrance, the beam is converged on a convergent point in a plane perpendicular to the analysis plane, and then diverged from the convergent point and are transmitted to the divergent element 4 from the exit, the divergent element 4 is for diverging the beam to a predetermined width in a vertical plane and then the beam is transmitted to the collimation element 5, the vertical plane is perpendicular to the analysis plane and parallel to the transmission direction of the beam at the exit, the collimation element 5 is used for parallelizing the beam in a transmission plane of the beam, the speed change and turning element 6 is used for enabling the beam to change speed so as to achieve a target energy while the beam is deflected so that the transmission direction of the beam is changed by a first pre-set angle.

Figure 2:
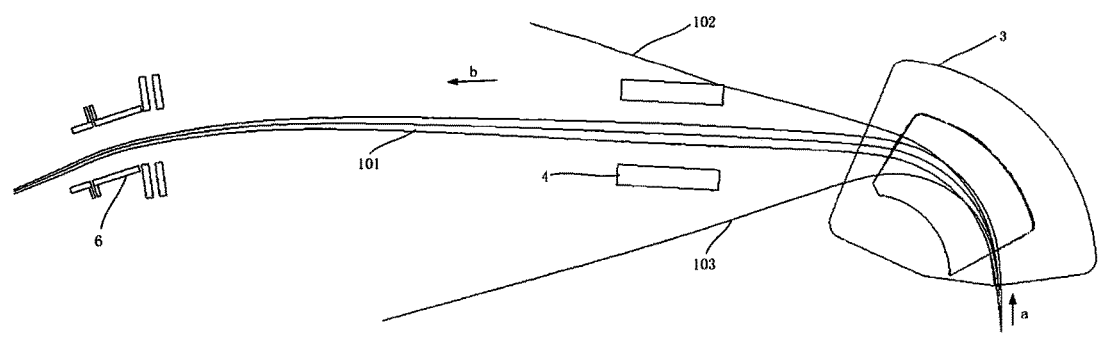
FIG. 2 is a top view illustrating the beam transmission of embodiment 1.

The beam transmission system is now described in detail with reference to FIG. 2-FIG. 4. In FIG. 2, from the top view, the paper plane is the analysis plane of the mass analyzer 3. In Cartesian coordinates, the direction perpendicular to the analysis plane is z axis, while the analysis plane is the X-Y plane. The beam is transmitted along direction a when entering the mass analyzer 3, and then be deflected in the plane perpendicular to the analysis plane, the beam is transmitted along direction b when leaving the mass analyzer 3 from the exit. Through the filter of the mass analyzer, only desired beam (ion beam 101 with required mass-to-charge) will be transmitted to the divergent element 4. After that, the beam 10 is diverged to a predetermined width (e.g. 450 mm) in the vertical plane and is parallelized by the collimation element 5 (not shown in FIG. 2). The parallelized beam is deflected by the speed change and turning element 6 and its speed is changed to the target energy, thus the neutral particles are filtered and the energy contamination is avoided. Through the coordinated cooperation of these optical elements, the target energy is achieved and implantation angle is uniform while a wide scale is covered by the beam.

Figure 3:
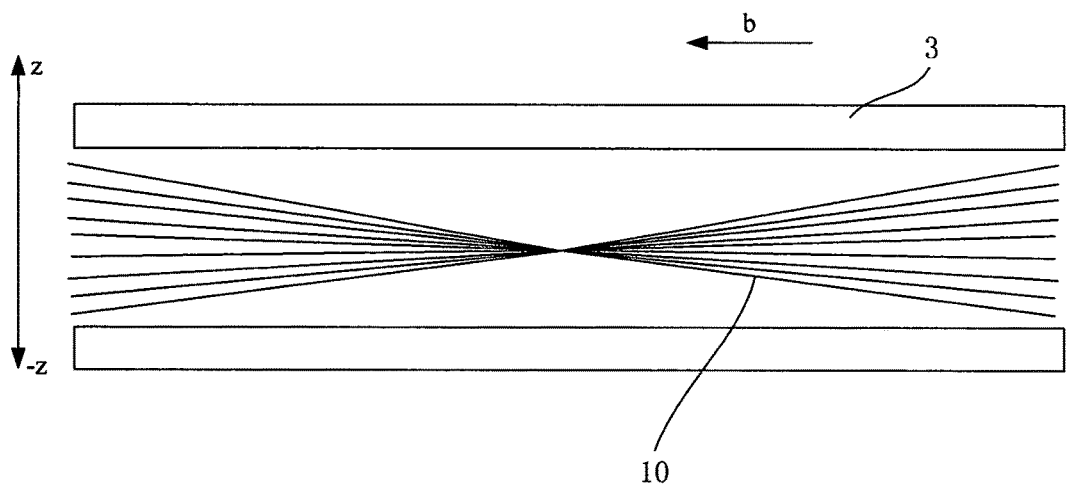
FIG. 3 shows the beam shape in the mass analyzer in embodiment 1.
Figure 4:
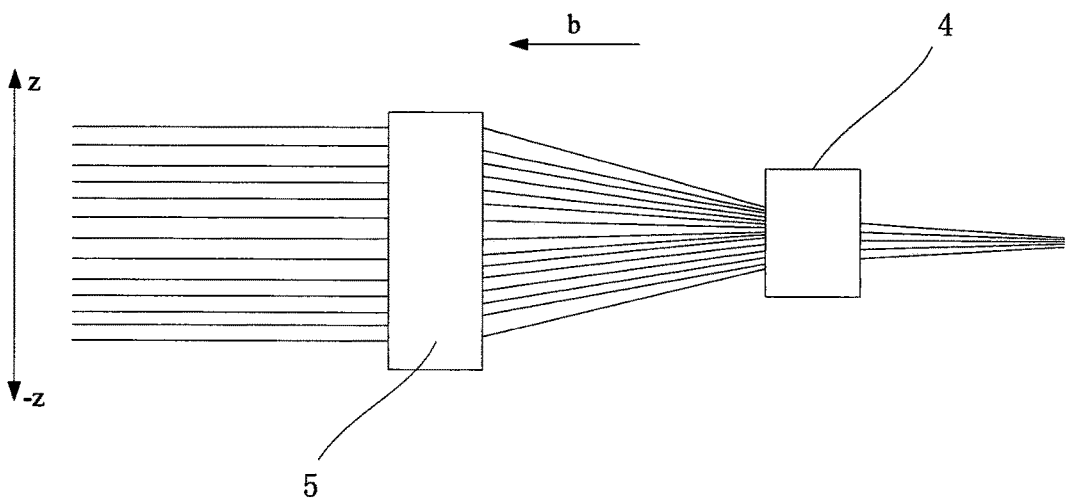
FIG. 4 shows the beam shape when the beam is transmitted by the divergent element and the collimation element in embodiment 1.
Figure 5:
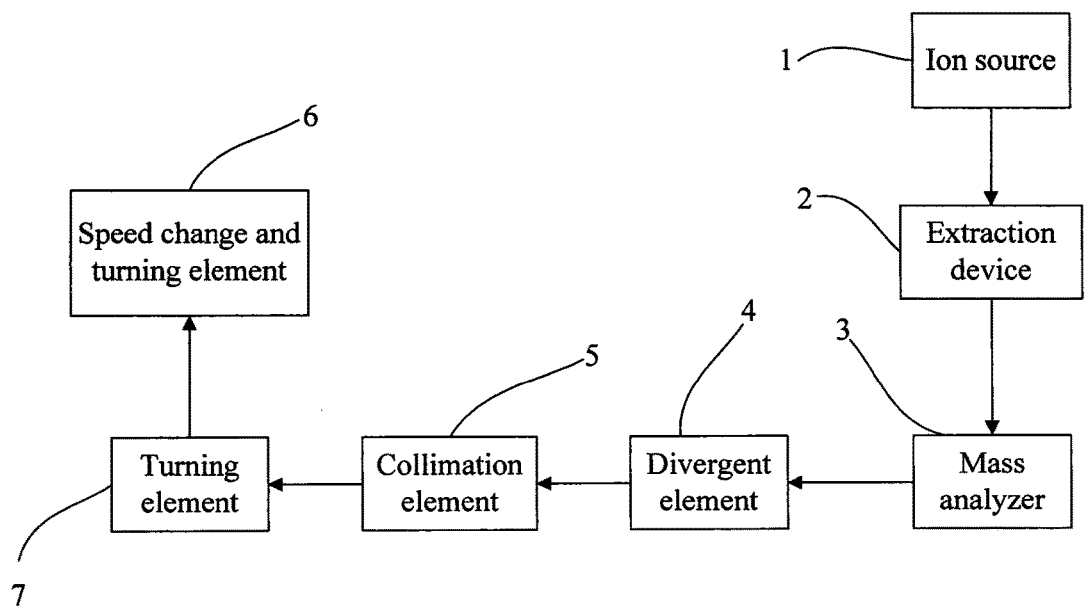
FIG. 5 is a structured flowchart illustrating the beam transmission system of embodiment 2.
Figure 6:
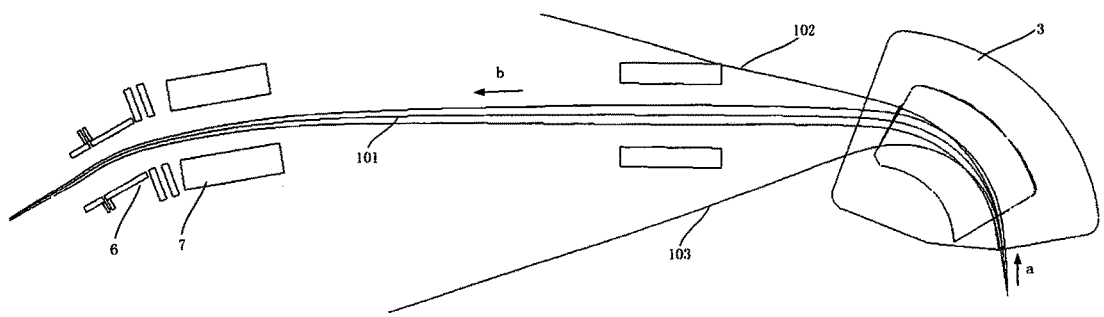
FIG. 6 is a top view illustrating the beam transmission of embodiment 2.

Refer to FIG. 3, the beam shape in the mass analyzer is now described in detail. In the embodiment, between the extraction device and the mass analyzer, the beam is focused. With the reference of FIG. 2 and FIG. 3, the analysis plane of the mass analyzer 3 is perpendicular to a focusing plane (paper plane of FIG. 3) of the extracted beam, wherein, after entering the entrance, the beam is converged on a convergent point in a plane perpendicular to the analysis plane, and then diverged from the convergent point and are transmitted to the divergent element 4 from the exit. The mass analyzer is effectively utilized since the focused beam as shown in the FIG. 3 is used. When the transmission length is definite, the opening of the mass analyzer could be smaller since the beam is crossed over in the mass analyzer. Thus, the distance between the upper surface and the lower surface of the mass analyzer is reduced and the magnet field in the mass analyzer is more uniform, which makes the beam shape easier to retain. Also, the final uniformity is ensured since the mass analyzer is arranged upstream. If the uniformity of upstream elements cannot be ensured, downstream uniformity will be deteriorated. Besides, in order to form a wide beam (e.g. 450 mm), before the divergent element, the beam has to have a suitable initial wide in the plane perpendicular to the analysis plane. Yet the beam width at the entrance needs to be wide if the mass analyzer is near the extraction device (if the distance between the mass analyzer and the extraction device is far, the beam width at the entrance can be narrow). For a compact implanter, the mass analyzer is near the extraction device, thus the opening of the mass analyzer is wide if the beam width at the entrance is wide, which will deteriorate the uniformity. In the invention, the beam is focused at the entrance so the beam could be diverged to a suitable width in the plane perpendicular to the analysis plane before transmitting to the divergent element, therefore even a compact implanter can produce a large-size beam.

In the embodiment, the divergent element is a linear quad pole magnet. With the quad pole magnet, the beam is converged in the analysis plane while being diverged in the vertical plane so that ion beams of the same kind will be focused, then different ion beams in the beam will separate in the analysis plane and only desired ion beam will be processed by downstream elements. Ion beams of the same kind are focused so that ion beams of different mass-to-charge ratios are separated in the analysis plane (namely ion beams of different mass-to-charge ratios have respective trajectories). Thus, the resolution of the beam transmission system is better, which optimizes the process quality and lowers the possibility of undesired doping.

The beam transmission method is now described, said method comprising the steps of:

step S1: extracting a focused beam from an ion source and transmitting the beam into a mass analyzer, the mass analyzer includes an entrance and an exit, wherein an analysis plane of the mass analyzer is perpendicular to a convergent plane of the extracted beam, step S2: deflecting the beam in the analysis plane by the mass analyzer so that trajectories of ion beams with different mass-to-charge ratios are formed in the analysis plane, wherein after entering an entrance, the beam is converged on a convergent point in a plane perpendicular to the analysis plane, and then diverged from the convergent point and are transmitted to the divergent element from the exit, step S3: diverging the beam to a predetermined width in a vertical plane, the vertical plane is perpendicular to the analysis plane and parallel to the transmission direction of the beam at the exit, step S4: parallelizing the beam in a transmission plane of the beam (paper plane of the FIG. 4), step S5: deflecting the transmission direction of the beam by a first pre-set angle and changing beam's speed to a target energy.

With the beam transmission method, a relatively wider distribution can be formed in a vertical plane, so the beam transmission method could be applied to the processing of a wafer with a large size. Also, since in the mass analyzer the beam is firstly converged and then diverged (in the vertical direction perpendicular to the analysis plane), the beam width at the entrance in the vertical plane is smaller, which means the size of the entrance can be decreased. Thus the magnet field in the mass analyzer is more uniform and the restraint to the beam shape in the vertical direction is better. The neutral particles are filtered by deflecting the beam so as to achieve a better processing quality with little energy contamination.

Especially, in step S3, the beam is converged in the analysis plane while being diverged in the vertical plane so that ion beams of the same kind will be focused, then different ion beams in the beam will separate and only desired ion beam will be processed by downstream elements.

Embodiment 2

The principle of embodiment 2 is similar to that of embodiment 1, the difference is as follows:

The beam transmission system further includes a turning element 7 provided between the collimation element 5 and the speed change and turning element 6, the turning element 7 is for deflecting the beam so that the transmission direction of the beam is changed by a second pre-set angle. the neutral particles are filtered by two deflections since two deflecting elements are arranged and each deflection angle could be small. Thus, the beam shape is easier to retain and the deformation of the beam can be avoided since the deflection angle each time is not big. Therefore even in the implantation position the beam uniformity is desired.

The beam transmission method of the embodiment is similar to the method of embodiment 1, the difference is: between step S4 and step S5: deflecting the beam so that the transmission direction of the beam is changed by a second pre-set angle.

In said technical solution, before implantation, the neutral particles are filtered twice and each deflection angle could be small. Thus, the beam shape is easier to retain since the deflection angle each time is not big. Therefore even in the implantation position the beam uniformity is desired since the deformation of beam shape due to the big deflection angle is avoided.

Embodiment 3

The principle of embodiment 3 is similar to that of embodiment 1, the difference is as follows:

The collimation element is for deflecting the beam in order to change the transmission direction by a third pre-set angle. Both the speed change and turning element and the collimation element (e.g. quad pole magnet) can deflect beam. Thus, the beam shape is easier to retain since the deflection angle each time is not big.

Embodiment 4

The principle of embodiment 4 is similar to that of embodiment 2, the difference is as follows:

The collimation element is for deflecting the beam in order to change the transmission direction by a third pre-set angle. The beam is deflected by three times so the neutral particles are filtered. Thus, the beam shape is easier to retain since the deflection angle each time is not big.

Experiment: Energy Contamination

SIMS profile is used to observe whether the energy contamination is avoided by using the invention. The concentration-depth profile of free drifting boron ions at 700 eV is almost the same as the concentration-depth profile of boron ions transmitted by the beam transmission method. The energy contamination is 0.03% at the doping concentration 1E19(ions/cc).

Uniformity

Figure 7:
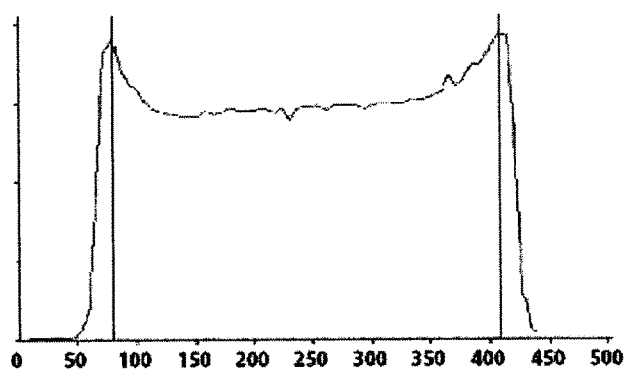
FIG. 7 shows the uniformity of the beam.

In FIG. 7, an aluminum foil is used to test the uniformity of the invention. Implanting boron ions at 700 eV into the aluminum foil and the beam width is 380 mm. In FIG. 7, the x axis is length 0-500 mm, the y axis is beam current. As we can see, the uniformity of beam current is good apart from the beam edges, especially, 250 mm-wide beam has the best uniformity.

Through the coordinated cooperation among a plurality of optical elements, a relatively wider distribution can be formed in a vertical plane, so the beam transmission system could be applied to the processing of a wafer with a large size (e.g. 450 mm). Also, the invention suits the needs of high integration since beam's energy is decreased to less than 1 keV before implantation and shallow junctions could be formed. If the requirement of uniformity is not strict, the deflection of beam could be achieved only by the speed change and turning element. As for circumstance that high uniformity is needed, the deflection could be achieved by a plurality of elements (the speed change and turning element, the turning element and the collimation element) and the neutral particles are filtered. With smaller deflecting angle of each time, desired uniformity and less energy contamination are both achieved.

A number of alternative structural elements and processing steps have been suggested for the preferred embodiment. Thus while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

Although the present invention has been described in terms of several embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A beam transmission system, comprising:
   an ion source and an extraction device, wherein the extraction device is for extracting an ion beam and focusing the ion beam,
   a mass analyzer, a divergent element, a collimation element and a speed change and turning element provided next to the collimation element, the mass analyzer includes an entrance and an exit, wherein an analysis plane of the mass analyzer is perpendicular to a convergent plane of the ion beam from the extraction device,
   the mass analyzer is used for deflecting the ion beam in the analysis plane for the ion beam with different mass-to-charge ratios are projected into different trajectories in the analysis plane for entering the entrance and converged on a convergent point in a plane perpendicular to the analysis plane, wherein the ion beam is then diverged from the convergent point and transmitted to the divergent element from the exit,
   the divergent element is for diverging the ion beam to a predetermined width in a vertical plane and then the ion beam is transmitted to the collimation element, wherein the vertical plane is perpendicular to the analysis plane and parallel to the transmission direction of the ion beam at the exit of the mass analyzer,
   the collimation element is used for parallelizing the beam in a transmission plane of the ion beam, and
   the speed change and turning element is used for adjusting a speed of the ion beam to control a target energy while the ion beam is deflected for adjusting a transmission direction of the ion beam by a first pre-set angle.

2. The beam transmission system as defined by claim 1, further comprising:
   a turning element disposed between the collimation element and the speed change and turning element, wherein the turning element deflecting the ion beam to adjust the transmission direction of the beam by a second pre-set angle.

3. The beam transmission system as defined by claim 2, wherein:
the collimation element further deflecting the ion beam to change the transmission direction by a third pre-set angle.

4. The beam transmission system as defined by claim 2 wherein:
the predetermined width is in a range of 450 mm-750 mm.

5. The beam transmission system as defined by claim 1, wherein:
the divergent element comprises a linear quad pole magnet.

6. The beam transmission system as defined by claim 5, wherein:
the collimation element further deflecting the ion beam to change the transmission direction by a third pre-set angle.

7. The beam transmission system as defined by claim 5 wherein:
the predetermined width is in a range of 450 mm-750 mm.

8. The beam transmission system as defined by claim 1, wherein:
the collimation element further deflecting the ion beam to change the transmission direction by a third pre-set angle.

9. The beam transmission system as defined by claim 1, wherein:
the predetermined width is in a range of 450 mm-750 mm.

10. A beam transmission method comprising:
step S1: extracting and focusing an ion beam from an ion source and transmitting the ion beam into a mass analyzer, wherein the mass analyzer includes an entrance and an exit and having an analysis plane perpendicular to a convergent plane of the ion beam extracted from the ion source,
step S2: deflecting the ion beam in the analysis plane of the mass analyzer to project the ion beam into different trajectories with different mass-to-charge ratios in the analysis plane, wherein the ion beam is converged on a convergent point in a plane perpendicular to the analysis plane after entering the entrance of the mass analyzer, and then diverged from the convergent point in transmitting to the divergent element from the exit of the mass analyzer,
step S3: the divergent element diverging the beam to a predetermined width in a vertical plane perpendicular to the analysis plane and parallel to the transmission direction of the ion beam at the exit,
step S4: parallelizing the beam in a transmission plane of the ion beam, and
step S5: deflecting the transmission direction of the ion beam by a first pre-set angle and adjusting a speed of the ion beam for projecting to a target.

11. The beam transmission method as defined by claim 10, further comprising a step between step S4 and step S5:
deflecting the beam to adjust the transmission direction of the beam by a second pre-set angle.

12. The beam transmission method as defined by claim 11 wherein
the predetermined width is in a range of 450 mm-750 mm.

13. The beam transmission method as defined by claim 10, further comprising in step S3 a step of:
converging the beam in the analysis plane while diverging the beam in the vertical plane.

14. The beam transmission method as defined by claim 13 wherein
the predetermined width is in a range of 450 mm-750 mm.

15. The beam transmission method as defined by claim 10 wherein step S4 further comprising a step:
deflecting the beam to adjust the transmission direction by a third pre-set angle.

16. The beam transmission method as defined by claim 10, wherein
the predetermined width is in a range of 450 mm-750 mm.

* * * * *